(12) United States Patent
Otremba

(10) Patent No.: US 8,188,596 B2
(45) Date of Patent: May 29, 2012

(54) MULTI-CHIP MODULE

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 1081 days.

(21) Appl. No.: 11/673,076

(22) Filed: Feb. 9, 2007

(65) Prior Publication Data

US 2008/0191342 A1   Aug. 14, 2008

(51) Int. Cl.
*H01L 23/02* (2006.01)

(52) U.S. Cl. ........ 257/723; 257/676; 257/288; 257/778; 257/724; 257/728; 257/E23.18; 257/E23.034; 438/108; 438/106; 438/123

(58) Field of Classification Search .................. 257/723, 257/676, 288, 778, 724, 728, E23.18, E23.034; 438/108, 106, 123

See application file for complete search history.

(56) References Cited

U.S. PATENT DOCUMENTS

| 6,066,890 | A | 5/2000 | Tsui et al. | |
|---|---|---|---|---|
| 6,144,093 | A * | 11/2000 | Davis et al. | 257/723 |
| 6,995,467 | B2 | 2/2006 | Herfurth et al. | |
| 7,095,099 | B2 * | 8/2006 | Oliver et al. | 257/676 |
| 2004/0056346 | A1 * | 3/2004 | Palm et al. | 257/706 |
| 2005/0151236 | A1 * | 7/2005 | Oliver et al. | 257/685 |
| 2005/0205887 | A1 | 9/2005 | Shei et al. | |
| 2005/0214980 | A1 | 9/2005 | Shiu et al. | |
| 2006/0017174 | A1 * | 1/2006 | Otremba | 257/778 |
| 2006/0056213 | A1 * | 3/2006 | Lee et al. | 363/144 |
| 2006/0145319 | A1 | 7/2006 | Sun et al. | |
| 2008/0180871 | A1 * | 7/2008 | Hebert et al. | 361/106 |

FOREIGN PATENT DOCUMENTS

| DE | 102 14 210 | 6/2003 |
|---|---|---|
| DE | 10 2005 034 012 | 11/2006 |
| EP | 0 817 254 | 7/1998 |

* cited by examiner

*Primary Examiner* — Junghwa M Im
(74) *Attorney, Agent, or Firm* — Dicke, Billig & Czaja, PLLC

(57) ABSTRACT

A multi-chip module is disclosed. In one embodiment, the multichip module includes a first chip, a second chip and a common chip carrier is disclosed. The first chip and the second chip are mounted on the common chip carrier. The second chip is mounted on the chip carrier in a flip-chip orientation. The second chip is electrically connected to the first chip via the chip carrier.

24 Claims, 3 Drawing Sheets

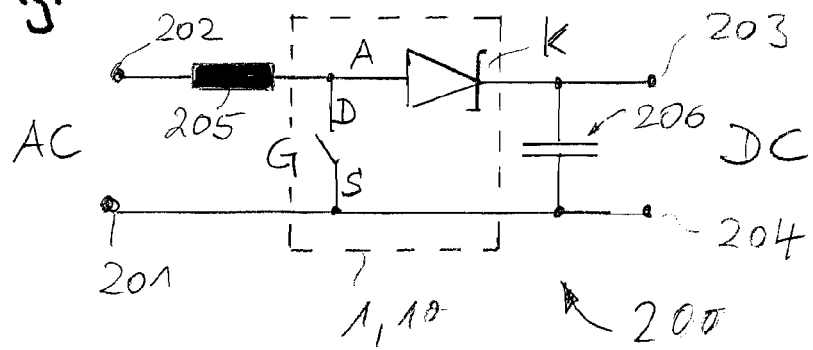
Fig. 4
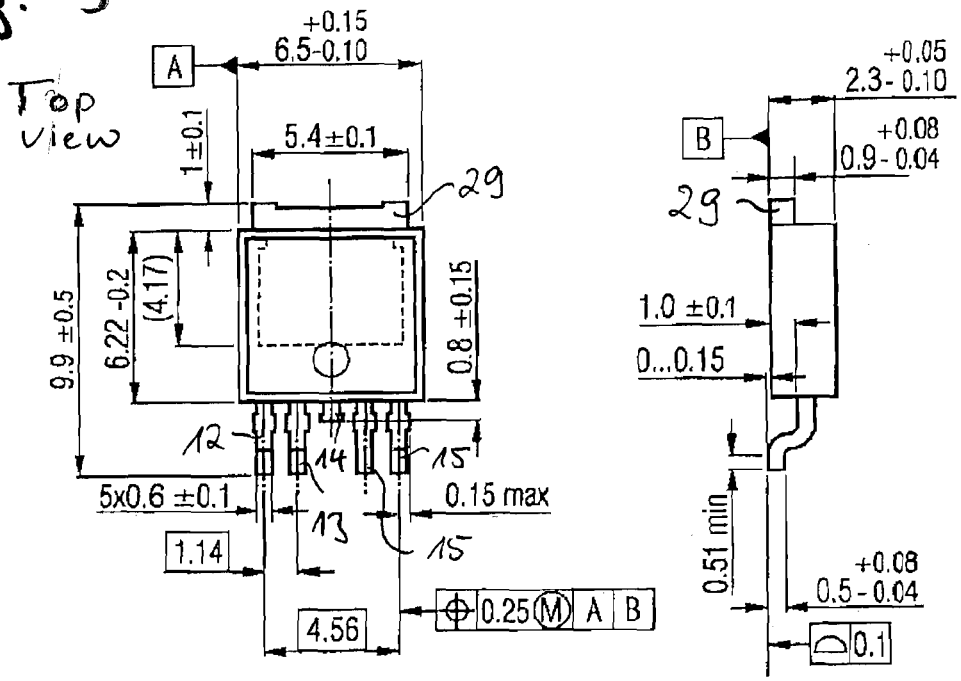
Fig. 5 Top view
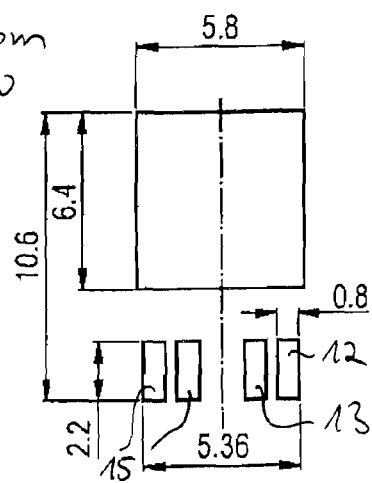
Bottom view

MULTI-CHIP MODULE

BACKGROUND

The invention relates to multi-chip modules and more particularly to circuit devices incorporating multiple chips within the same package.

Typically, a circuitry includes a number of components which provide for various functions of the circuitry. Basically, different approaches in view of the level of integration of these functions are possible. Different functions may be may be implemented in the same integrated circuit or may be provided by separate integrated circuits. In the second case, the separate integrated circuits may be embodied in separate circuit modules or integrated in the same circuit module. A circuit module in which two or more integrated circuits are grouped is termed a multi-chip module (MCM). In other words, circuitry design offers different levels of integration—from an all-integrated approach through a MCM design to a circuit arrangement using separate modules for different integrated circuits.

SUMMARY

One embodiment provides a multi-chip module having a first chip, a second chip and a common chip carrier. The first chip and the second chip are mounted on the common chip carrier. The second chip is mounted on the chip carrier in a flip-chip orientation. The second chip is electrically connected to the first chip via the chip carrier.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a circuit diagram of a circuitry using a multi-chip module.

FIG. 5 illustrates top, side and plan views of a multi-chip module comprised in a package.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Multi-chip modules described in the following include two or more chips mounted on a common chip carrier. The chips may have two, three or more conductive contacts. For example, each chip may be a vertical semiconductor device, e.g., a power transistor or a power diode.

The shared chip carrier provides an electric connection between the first chip and the second chip. The chip carrier may be made of a metal, an alloy or a dielectric, plastic or ceramic carrier element covered by a conductive layer. Examples for such chip carrier are a die pad forming a part of a lead frame or a resin or ceramic substrate using one or more conductive redistribution layer.

The multi-chip module may further include a mold compound. The mold compound may for example be made of a thermoplastic resin or a thermosetting plastic, for example epoxy resin. It typically encapsulates all chips of the multi-chip module. The backside of the chip carrier may either be over-molded by the mold compound or may remain exposed. It is also possible that the chip carrier or the chips are connected to a heat sink which is at least partially uncovered by mold material.

Embodiments of the module may be implemented in various circuitry, among them voltage regulators, control circuits, particularly motor control units, DC-DC step-up or step-down converters or AC-DC step-up or step-down converters. Embodiments of the module may be specifically implemented in any circuitry in which the drain contact of a transistor is coupled to the anode contact of a diode.

Figure 1:
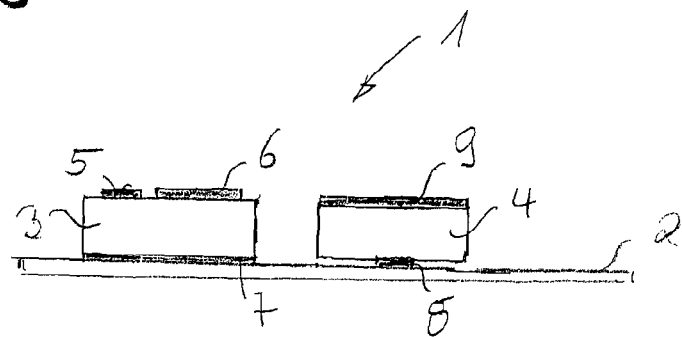
FIG. 1 illustrates a cross-sectional side view of a first multi-chip module.

Same reference signs designate like parts in the accompanying drawings. FIG. 1 illustrates an embodiment of a multi-chip module 1. The multi-chip module 1 includes a chip carrier or die pad 2. The die pad 2 may be a part of a lead frame made of a metal or a metal alloy. It may, for instance, also be a ceramic substrate covered with a metal layer. Such substrates are known as DCB (Direct Copper Bonded) substrates and are typically used as a carrier for power semiconductor devices.

A first chip 3 and a second chip 4 are mounted on the die pad 2. Both chips 3 and 4 may be power semiconductor devices. For instance, chip 3 may be a three-terminal semiconductor die having a first conductive contact 5 and a second conductive contact 6 on top of the chip 3 and a third conductive contact 7 at the bottom of the chip 3. Examples for three-terminal power semiconductor devices are power MOSFETs (Metal Oxide Semiconductor Field Effect Transistors), JFETs (Junction Field Effect Transistors), IGBTs (Insulated-Gate Bipolar Transistors), BJTs (Bipolar Junction Transistors) or thyristors.

The two contacts 5, 6 on the top of the chip 3 are connected by wire-bonds, metal clips, ribbon bonds or other suitable connection means (not illustrated) to leads (not illustrated) which provide external electric contacts of the module 1. The bottom contact 7 of the first chip 3 electrically contacts the die pad 2.

The second chip 4 may also be a power semiconductor device. By way of example, in FIG. 1, the second chip 4 is a two-terminal power semiconductor device, for instance a Schottky diode or a PN diode. It has a top conductive contact 8 and a bottom conductive contact 9. As displayed in FIG. 1, the second chip 4 is flip-chip mounted on the die pad 2, i.e. arranged in a face-down orientation on the die pad 2. Therefore, the top conductive contact 8 is electrically connected to the die pad 2.

The first chip 3 is electrically connected to the second chip 4 via the bottom conductive contact 7, the die pad 2 and the top conductive contact 8. It may also be the case that the first chip 3 is not equipped with a bottom conductive contact 7, e.g., if the first chip 3 is a horizontal semiconductor device having all conductive contacts at the top surface, which is the active surface of the first chip 3. Then, the die pad 2 may be electrically connected to the first chip 3 via a wire-bond or other suitable means in order to electrically interconnect the first chip 3 to the second chip 4 by the shared die pad 2.

Irrespective whether the first chip 3 is a vertical or horizontal semiconductor device, the first chip 3 may be mounted on the die pad 2 in the normal, upright orientation.

Figure 2:
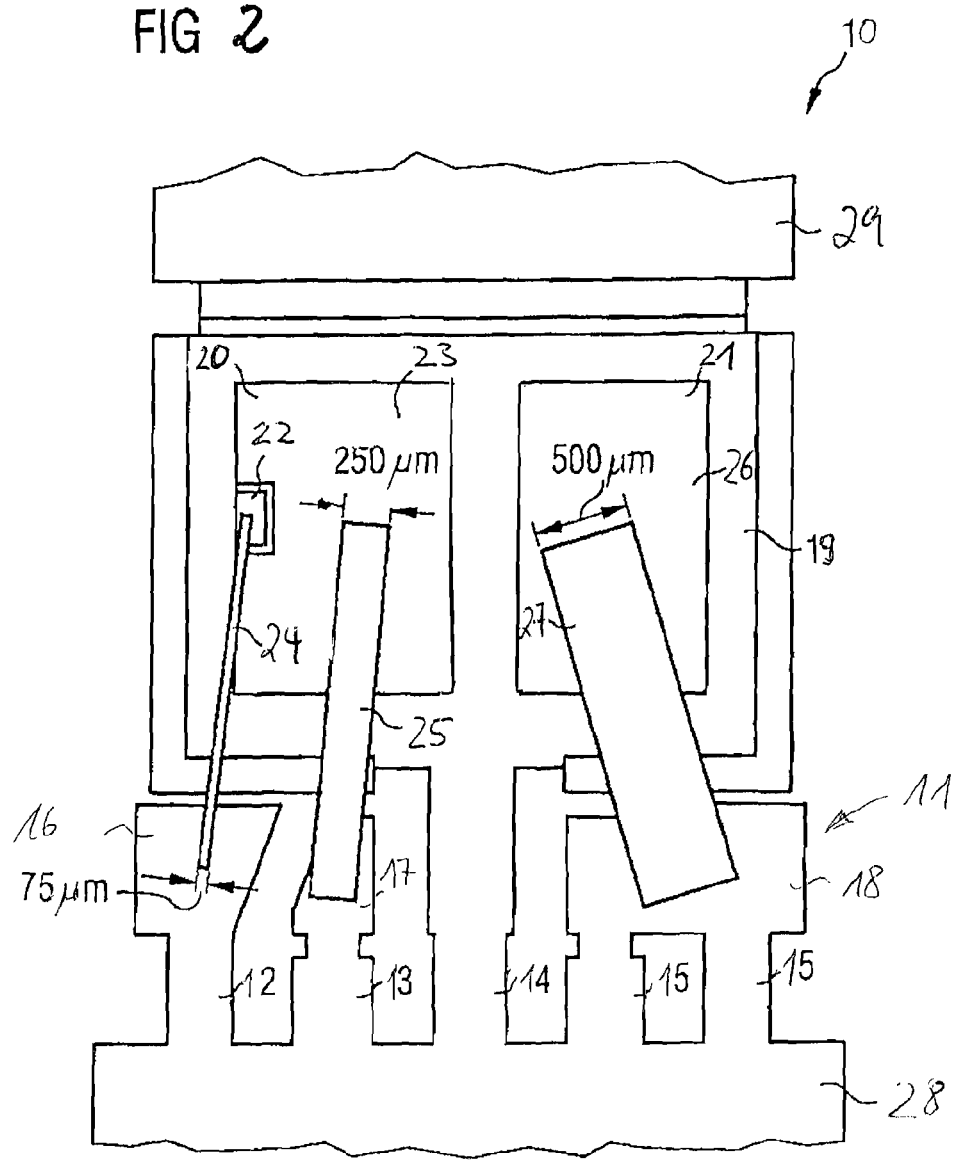
FIG. 2 illustrates a top view of a second multi-chip module.

FIG. 2 illustrates in more detail an embodiment of a multi-chip module 10 which is designed in accordance with the arrangement illustrated in FIG. 1. All features described in conjunction with FIG. 1 may equally apply to the embodiment illustrated in FIG. 2.

A lead frame 11 includes leads 12, 13, 14, 15. Leads 12, 13, 15 interconnect to lead posts 16, 17, 18, respectively. The central lead 14 interconnects to a die pad 19. Die pad 19 corresponds to die pad 2 in FIG. 1.

In FIG. 2, the first chip 3 is denoted by reference sign 20 and the second chip 4 is denoted by reference sign 21. The first and the second chips 20, 21 are disposed on the die pad 19 as explained in conjunction with FIG. 1.

In one embodiment illustrated in FIG. 2, the first chip 20 may be a vertical n-type power transistor 20. The power transistor 20 has two top contacts, namely a gate contact 22 and a source contact 23. The gate contact 22 is connected to the lead post 16 by a thin bond wire 24. The interconnection between the source contact 23 and the lead post 17 may be accomplished by a thicker bond wire 25. Lead 12 provides the gate terminal and lead 13 provides the source terminal of the module 10.

As an example, the thin bond wire 24 may have a width of about 75 μm and the width of the thick bond wire may be about e.g., 250 μm depending on the current demand of the power transistor chip 20.

The drain contact of the n-type power transistor 20 is the bottom contact 7, see FIG. 1. The drain contact 7 is electrically connected to lead 14 via the die pad 19.

The second chip 21, which may be a two-terminal power diode, is flip-chip mounted on the die pad 19 as explained above in conjunction with FIG. 1. It may be a NP power diode or a Schottky power diode.

Figure 3:
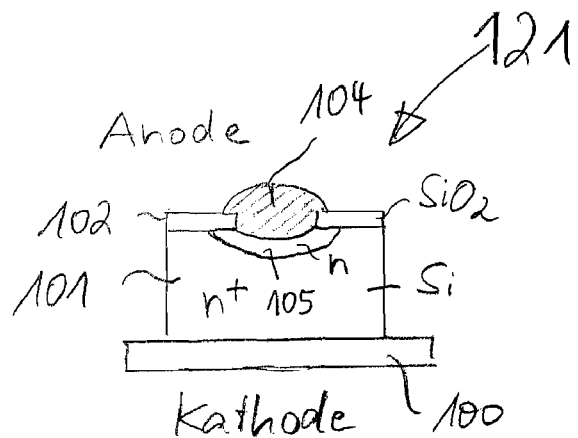
FIG. 3 illustrates the design of a n-doped Schottky power diode.

The structure of a n-type Schottky power diode 121 is exemplified in FIG. 3. The Schottky power diode 121 includes a bottom metallization 100, a semiconductor die 101, an insulating layer 102 and a top metal electrode 104. The metallization 100 serves as a bulk electrode and represents the cathode of the Schottky power diode 121. The die 101 may be made of $n^+$-doped silicon. A central region 105 at the top surface of the die 101 is n-doped, i.e. has a lower dopant concentration than the bulk silicon region. This central region 105 is contacted by the metal electrode 104 forming an anode of the Schottky diode 121. The insulating layer 102, which may be made of $SiO_2$, has an orifice through which the metal electrode 104 contacts the n-doped central region 105.

The diode 21 is flip-chip mounted on die pad 19. In case the diode 21 is the n-type Schottky diode 121 illustrated in FIG. 3, the top conductive contact 104 (anode) is electrically connected to the die pad 19 and the metallization 100 (cathode) forms the upper conductive contact 26 (cf FIG. 2) of the Schottky diode 121. The upper conductive contact 26 (cathode) is interconnected to lead post 18 via a bond wire 27 or other suitable connecting mechanism as mentioned above. The bond wire 27 may have a width of about 500 μm depending on the current demand of the diode 21.

Leads 12, 13, 14, 15 serve as external terminals of the module 10. As is apparent for a person skilled in the art, lead frame bar 28 interconnecting leads 12, 13, 14, 15 will be cut-off during the manufacturing process such that leads 12, 13, 14, 15 will be insulated from each other at the finished module 10.

A heat sink 29 may be contacted to the bottom of the die pad 19. Further, according to another embodiment, heat sinks may be directly contacted to each of the power chips 20, 21.

It is also possible that the first chip 20 or the second chip 21 are p-type semiconductor devices. Provided the first chip 3 is a p-type vertical power transistor 20 and the second chip 4 is a p-type power diode 21, the source of the p-type power transistor 20 is connected to the cathode of the flip-chip mounted power diode 21 by the shared die pad 19. As p-type power semiconductor devices typically need more die area than n-type power semiconductor devices, most power semiconductor devices are implemented as n-type power semiconductor devices in the art.

Module 10 may be implemented in various circuitry. One possible application is illustrated in FIG. 4. FIG. 4 depicts a simplified schematic of an AC-DC step-up converter 200. The step-up converter 200 includes two input terminals 201, 202 and two output terminals 203, 204. Input terminal 201 is connected to lead 13 (source terminal of transistor 20) and to the output terminal 204 of the AC-DC step-up converter 200. Input terminal 202 is connected to a first terminal of an inductor 205. The second terminal of inductor 205 is connected to lead 14 of module 1, 10 and thus to the die pad 19 which is in electrical contact with the (bottom) drain of transistor 20 and the down-flipped anode of diode 21. Lead 15 representing an output of module 10 is connected to the output terminal 203 of the AC-DC step-up converter 200. A capacitor 206 is coupled between the two output terminals 203, 204.

AD/DC step-up converter 200 is operative to convert an AC input voltage to a DC output voltage having a voltage level which exceeds the voltage level of the AC input voltage. The voltage amplification factor depends on design parameters and the duty cycle of the power switch embodied by transistor 20 which, in this application, may be a n-channel power MOSFET. The gate G of power switch MOSFET 20 is controlled via lead 12 by external circuitry which is not illustrated in FIG. 4.

As an example, the AC-DC step up converter may convert an AC input voltage of more than 100 V (for instance 220 V) into a DC output voltage of several 100 V (e.g., 300 V). To this end, the module 10 may employ, for instance, a 600 V power MOSFET 20 and a 600 V SiC-Schottky diode 21.

As already mentioned, the module 1, 10 may be used in various other circuitry (e.g., also in a AC-DC step down converter) and particularly in any circuitry in which a drain contact of a transistor 20 is e.g., directly coupled to an anode contact of a diode 21. In any such circuitry, the flip-chip orientation of the diode 21 on the die pad 19 allows to dispose the transistor 20 and the diode 21 on the same, shared die pad 19. In other words, in any such circuitry, a part of the circuitry (as indicated by the dashed line in FIG. 4) may be implemented in a multi-chip module 1, 10 which uses a common die pad 2, 19 for the transistor 20 and the flip-chip mounted diode 21. Using a common die pad 2, 19 for these two components is cost effective and beneficial to heat removal capabilities.

Typically, the assembly illustrated in FIG. 1 is packaged. Packaging may be accomplished by incorporating the arrangement illustrated in FIG. 2 into a mold compound. FIG. 5 illustrates an embodiment in which the multi-chip module 10 includes a mold compound package. As an example, a five-terminal TO 252 package may be used. Possible dimensions of such package are indicated in FIG. 5 in units of mm. As may be seen in the bottom view, the package may have a footprint of 5.8 mm×6.4 mm. Including leads 12, 13, 15, the multi-chip module 10 may have a length of 10.6 mm. Of course, other dimensions as indicated in FIG. 5 are possible if appropriate.

Figure 6:
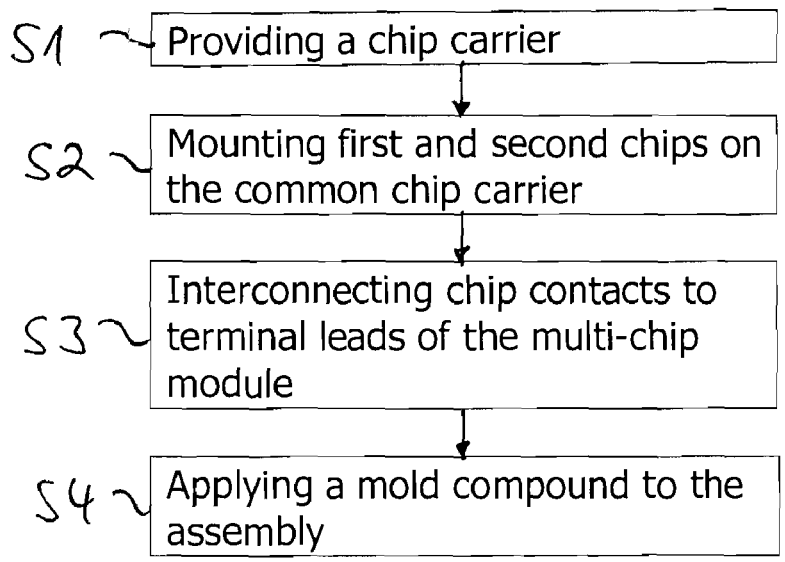
FIG. 6 illustrates a flow diagram of a method for manufacturing a multi-chip module.

FIG. 6 illustrates a flow diagram showing a process for producing embodiments of multi-chip modules 1, 10 as described above.

At S1, a chip carrier, e.g., a lead frame, is provided.

At S2, the first chip 3 (e.g., power transistor 20) and the second chip 4 (e.g., power diode 21) are mounted on the common chip carrier, e.g., die pad 2, 19 of the lead frame. As already mentioned, the second chip 4 is mounted on the chip carrier in a flip-chip orientation.

Mounting may be accomplished with conventional assembly techniques using conductive epoxy, soldering material, eutectic materials or any other suitable materials and methods. In particular, the joining method of diffusion soldering may be applied. This technique involves the use of a solder material showing reaction diffusion and isothermal solidification at the bonding temperature, resulting in that the remelt temperature of the finished solder bond is considerably higher than the process bonding temperature. As an example, the transistor 20 may first be bonded to the die pad 19 by diffusion soldering. Then, the diode 21 may be bonded to the die pad 19 by any soldering technique, for instance also by diffusion soldering. It is also possible to first bond the diode 21 to the die pad 19 by diffusion soldering and then to mount the transistor 20.

At S3, remaining chip contacts are interconnected to terminal leads of the multi-chip module 1, 10. Any suitable technique, for instance wire-bonding, clip-bonding or ribbon-bonding may be used.

Then, at S4, a mold compound may be applied to the assembly. The mold compound may completely encapsulate the assembly except terminal leads 12 to 15 or may provide for exposed die pad 19 or heat sink 29 surfaces in order to allow an efficient removal of heat dissipated during operation in the multi-chip module 1, 10.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An AC-DC voltage converter module, comprising:
   a first output and a second output;
   a first chip comprising a transistor having a drain terminal;
   a second chip comprising a diode having an anode;
   a common chip carrier on which the first chip and the second chip are mounted; wherein
   the second chip is mounted on the chip carrier in a flip-chip orientation; and
   the second chip is electrically connected to the first chip via the chip carrier, wherein the anode of the diode is electrically connected to the drain terminal of the transistor via the chip carrier, wherein the common the chip carrier of the AC-DC voltage converter is formed by a die pad of a metal lead frame, and wherein the first chip is connected between the common chip carrier and the second output, and the second chip is connected between the common chip carrier and the first output.

2. The AC-DC voltage converter according to claim 1, comprising wherein the second chip is a vertical conductive semiconductor device.

3. The AC-DC voltage converter according to claim 1, comprising wherein the first chip is a vertical conductive semiconductor device.

4. The AC-DC voltage converter according to claim 1, comprising wherein the second chip is a power semiconductor device.

5. The AC-DC voltage converter according to claim 1, comprising wherein the first chip is a power semiconductor device.

6. The AC-DC voltage converter according to claim 1, comprising wherein the first chip is a transistor.

7. The AC-DC voltage converter according to claim 6, comprising wherein the drain of the transistor is connected to the chip carrier.

8. The AC-DC voltage converter according to claim 1, comprising wherein the chip carrier is a die pad of a metal lead frame.

9. The AC-DC voltage converter according to claim 1, comprising wherein the chip carrier is a ceramic substrate covered by a metal layer.

10. The AC-DC voltage converter according to claim 1, comprising a mold compound encapsulating the chip carrier, the first chip and the second chip.

11. The AC-DC voltage converter of claim 1, further including a heat sink connected to the chip carrier.

12. An AC-DC voltage converter, comprising:
   a multi-chip module, comprising
   a first input and a second input;
   a first output and a second output;
   a first chip comprising a transistor having a drain connected to a first conductive contact of the first chip, the first conductive contact of the first chip connected to the first input;
   a second chip comprising a diode having an anode connected to a first conductive contact of the second chip, the first conductive contact of the second chip connected to the first input;
   a common chip carrier on which the first chip and the second chip are mounted; wherein
   the second chip is mounted on the chip carrier in a flip-chip orientation; and
   the first conductive contact of the second chip is connected to the first conductive contact of the first chip via the chip carrier, wherein the common chip carrier of the AC-DC voltage converter is formed by a die pad of a metal lead frame, and wherein the first chip is connected between the common chip carrier and the second output, wherein the second conductive contact of the first chip is coupled to the second output, the second chip is connected between the common chip carrier and the first output, and the second conductive contact of the second chip is coupled to the first output.

13. The AC-DC voltage converter according to claim 12, comprising wherein the first chip is a n-type semiconductor device and the second chip is a n-type semiconductor device.

14. The AC-DC voltage converter according to claim 13, comprising wherein the first chip is a transistor and the first contact of the transistor is the transistor drain.

15. The AC-DC voltage converter according to claim 12, comprising wherein a second input of the first chip is coupled to the second input of the multi-chip module.

16. The AC-DC voltage converter according to claim 12, comprising wherein a second conductive contact of the first chip is coupled to the second input of the multi-chip module.

17. The AC-DC voltage converter according to claim 16, comprising wherein the second input of the multi-chip module is coupled to the second output of the multi-chip module.

18. The AC-DC voltage converter according to claim 12, comprising:
a first circuitry coupled to the first and second inputs of the multi-chip module;
a second circuitry coupled to the first and second outputs of the multi-chip module; wherein
the circuit arrangement is selected from the group consisting of a voltage converter, a voltage regulator or a voltage control device.

19. A method for producing a multi-chip module, comprising:
mounting a first chip on a chip carrier, the first chip comprising a transistor having a drain terminal;
mounting a second chip on the chip carrier in a flip-chip orientation, the second chip comprising a diode having an anode, wherein the first and second chips are mounted on the chip carrier by diffusion soldering, wherein the first and second chips are mounted on the chip carrier one after the other; wherein
the second chip is electrically connected to the first chip via the common chip carrier; and wherein the anode of the diode is electrically coupled to the drain terminal of the transistor via the chip carrier.

20. An AC-DC voltage converter, comprising:
a first output and a second output;
a first chip comprising a transistor having a drain terminal;
a second chip comprising a diode having an anode;
means for providing a common chip carrier on which the first chip and the second chip are mounted; wherein
the second chip is mounted on the chip carrier means in a flip-chip orientation; and
the second chip is electrically connected to the first chip via the chip carrier means, wherein the anode of the diode is electrically connected to the drain terminal of the transistor via the chip carrier means, wherein the common chip carrier of the AC-DC voltage converter module comprises a die pad of a metal lead frame, and wherein the first chip is connected between the common chip carrier and the second output, and the second chip is connected between the common chip carrier and the first output.

21. The AC-DC voltage converter of claim 1, wherein the drain terminal of the transistor and the anode of the diode are arranged on a common plane of the multi-chip module spanned by a surface of the chip carrier.

22. A multi-chip module, comprising:
a first output and a second output;
a first chip comprising a p-type power transistor having a source terminal;
a second chip comprising a diode having a cathode;
a common chip carrier on which the first chip and the second chip are mounted, wherein the second chip is mounted on and is electrically connected to the first chip via the common chip carrier, wherein the cathode of the diode is electrically connected to the source terminal of the transistor via the common chip carrier, wherein the common chip carrier comprises a die pad of a metal lead frame, and wherein the first chip is connected between the common chip carrier and the second output, and the second chip is connected between the common chip carrier and the first output.

23. The multi-chip module of claim 22, wherein the source terminal of the transistor and the cathode of the diode are arranged on a common plane of the multi-chip module spanned by a surface of the chip carrier.

24. The multi-chip module of claim 22, wherein the chip carrier comprises a lead frame and the source terminal of the transistor and the cathode of the diode are arranged on a shared die pad of the lead frame.

* * * * *